(12) United States Patent
Kim

(10) Patent No.: US 12,113,158 B2
(45) Date of Patent: Oct. 8, 2024

(54) LIGHT EMITTING DIODE PACKAGE

(71) Applicant: SEOUL SEMICONDUCTOR CO., LTD., Gyeonggi-do (KR)

(72) Inventor: Ji Ho Kim, Gyeonggi-do (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 583 days.

(21) Appl. No.: 17/116,399

(22) Filed: Dec. 9, 2020

(65) Prior Publication Data
US 2021/0091287 A1 Mar. 25, 2021

Related U.S. Application Data

(63) Continuation of application No. PCT/KR2019/006996, filed on Jun. 11, 2019.

(30) Foreign Application Priority Data

Jun. 11, 2018 (KR) .................. 10-2018-0067055

(51) Int. Cl.
*H01L 33/62* (2010.01)
*H01L 33/38* (2010.01)
*H01L 33/48* (2010.01)

(52) U.S. Cl.
CPC ............. *H01L 33/62* (2013.01); *H01L 33/38* (2013.01); *H01L 33/486* (2013.01)

(58) Field of Classification Search
CPC ....... H01L 33/62; H01L 33/38; H01L 33/486; H01L 25/167; H01L 33/48; H01L 33/20; H01L 33/483
See application file for complete search history.

(56) References Cited

U.S. PATENT DOCUMENTS 9,851,826 B2 12/2017 Fong
2009/0121252 A1* 5/2009 Hsu ................. H01L 33/486
257/E33.001

(Continued)

FOREIGN PATENT DOCUMENTS

CN 105304805 A 2/2016
EP 2950358 A2 12/2015

(Continued)

OTHER PUBLICATIONS

International Search Report issued in International Application PCT/KR2019/006996, mailed Sep. 24, 2019.

(Continued)

*Primary Examiner* — Su C Kim
(74) *Attorney, Agent, or Firm* — Perkins Coie LLP

(57) ABSTRACT

A light emitting diode package includes a light emitting diode chip provided at a lower side thereof with a first electrode pad and a second electrode pad, a first lead and a second lead spaced apart from each other and contacting the first electrode pad and the second electrode pad of the light emitting diode chip to be electrically connected thereto, respectively, and a housing formed to surround the first lead and the second lead and having a cavity open at a top portion thereof. The first lead and the second lead have a first lead exposing plane and a second lead exposing plane disposed on a lower surface of the cavity of the housing and partially exposing the first lead and the second lead, respectively.

21 Claims, 12 Drawing Sheets

(56) References Cited

U.S. PATENT DOCUMENTS

| | | | |
|---|---|---|---|
| 2010/0207152 A1* | 8/2010 | Won | H01L 33/62 |
| | | | 257/E33.056 |
| 2011/0031513 A1* | 2/2011 | Hsieh | H01L 33/44 |
| | | | 257/E33.059 |
| 2013/0001632 A1 | 1/2013 | Imai et al. | |
| 2014/0110728 A1* | 4/2014 | Lee | H01L 25/075 |
| | | | 438/27 |
| 2016/0133808 A1 | 5/2016 | Brandl et al. | |
| 2016/0351548 A1* | 12/2016 | Chen | H01L 25/0753 |
| 2017/0288109 A1* | 10/2017 | Dijkstra | H01L 33/486 |
| 2018/0175265 A1* | 6/2018 | Kim | H01L 27/15 |
| 2018/0190889 A1* | 7/2018 | Vakkalanka | H01L 33/60 |

FOREIGN PATENT DOCUMENTS

| | | |
|---|---|---|
| EP | 29503578 A2 | 12/2015 |
| JP | 2011151323 A | 8/2011 |
| JP | 2012182215 A | 9/2012 |
| KR | 10-2010-0028080 | 3/2010 |
| KR | 20140089896 A | 7/2014 |
| KR | 10-2015-0141337 A | 12/2015 |
| KR | 20150141337 A | 12/2015 |
| KR | 10-2016-0041599 | 4/2016 |
| KR | 10-2016-0061297 | 5/2016 |
| KR | 20160057146 A | 5/2016 |
| KR | 10-1627178 A | 6/2016 |
| KR | 101627178 B1 | 6/2016 |
| KR | 10-2017-0141306 | 12/2017 |
| KR | 20170141306 A | 12/2017 |
| KR | 10-2018-0009567 A | 1/2018 |
| KR | 20180009567 A | 1/2018 |
| KR | 10-2018-0041489 A | 4/2018 |
| KR | 20180041489 A | 4/2018 |
| WO | 2014184698 A1 | 11/2014 |
| WO | 2015092781 A1 | 6/2015 |

OTHER PUBLICATIONS

English translation of Office Action from corresponding Indian Patent Application No. 202238032065 dated Oct. 28, 2022 (14 pages).

English translation of Office Action from corresponding Chinese Patent Application No. 201980002157.9 dated Jul. 25, 2022 (13 pages).

First Exam Report issued in corresponding IN Application No. 202037047546, issued Dec. 7, 2021, and English translation thereof, 18 pages.

Extended European Search Report for European Application No. 19820318.4, issued Feb. 2, 2022, 11 pages.

English translation of Office Action from corresponding Korean Patent Application No. 1020180067055 dated Jan. 13, 2023 (5 pages).

Office Action from corresponding Korean Patent Application No. 10-2018-0067055 dated Jun. 11, 2023 (4 pages).

* cited by examiner

RELATED ART

LIGHT EMITTING DIODE PACKAGE

CROSS-REFERENCE TO RELATED APPLICATIONS AND PRIORITY

This application is a continuation of International Patent Application No. PCT/KR2019/006996, filed on Jun. 11, 2019, and claiming priority to and the benefit of Korean Patent Application No. 10-2018-0067055, filed on Jun. 11, 2018, each of which is incorporated by reference for all purposes as if fully set forth herein.

TECHNICAL FIELD

Embodiments of the present disclosure relate to a light emitting diode package, and more particularly, to a light emitting diode package capable of improving luminous efficacy of light emitted therefrom.

BACKGROUND

A light emitting diode is an inorganic light source adapted to generate light through recombination of electrons and holes. In recent years, light emitting diodes are used in various fields including a display apparatus, a vehicular lamp, general lighting, and the like. The light emitting diode has various advantages, such as longer lifespan, lower power consumption and rapider response time than existing light sources. With such advantages, light emitting diodes have replaced existing light sources.

FIG. 1 is a top plan view of a conventional light emitting diode package and FIG. 2 is a cross-sectional view taken along line S-S' of FIG. 1 in the related art.

A typical light emitting diode package includes a first lead and a second lead separated from each other and a housing adapted to support the first lead and the second lead. The housing may have a cavity 15 formed to expose upper surfaces of the first lead and the second lead. The cavity 15 is formed to open a top portion of a central region of the housing while exposing the first lead and the second lead through a lower portion thereof. In addition, a light emitting diode chip is mounted on the first lead. The light emitting diode chip is electrically connected to the first lead and the second lead through a wire.

In such a typical light emitting diode package, the first lead and the second lead are exposed over a lower surface of the cavity 15.

In the related art, since the housing is formed of a white synthetic resin, the first lead and the second lead have lower reflectivity than the housing, thereby causing deterioration in luminous efficacy of the light emitting diode package.

Moreover, since the light emitting diode chip is electrically connected to the first lead and the second lead through the wire, the wire may obstruct light emitted from the light emitting diode chip.

SUMMARY

Embodiments of the present disclosure provide a light emitting diode package capable of improving luminous efficacy.

In accordance with embodiments of the present disclosure, a light emitting diode package includes: a light emitting diode chip provided at a lower side thereof with a first electrode pad and a second electrode pad; a first lead and a second lead spaced apart from each other and contacting the first electrode pad and the second electrode pad of the light emitting diode chip to be electrically connected thereto, respectively; and a housing formed to surround the first lead and the second lead and having a cavity open at a top portion thereof. The first lead and the second lead have a first lead exposing plane and a second lead exposing plane disposed on a lower surface of the cavity of the housing and partially exposing the first lead and the second lead, respectively. The first lead exposing plane and the second lead exposing plane may be formed in sizes and shapes corresponding to the first electrode pad and the second electrode pad, respectively.

Each of the first lead and the second lead may be formed on an upper surface thereof with a groove such that only the first lead exposing plane and the second lead exposing plane are exposed to the lower surface of the cavity therethrough. The grooves of the first lead and the second lead may be occupied with the housing.

The sizes and shapes of the first lead exposing plane and the second lead exposing plane may be the same as those of the first electrode pad and the second electrode pad, respectively.

Each of the first electrode pad and the second electrode pad may have a rectangular shape; each of the first lead exposing plane and the second lead exposing plane may have a rectangular shape; and one side of the rectangular shape of each of the first lead exposing plane and the second lead exposing plane may be placed outside one side of the rectangular shape of each of the first electrode pad and the second electrode pad.

The first electrode pad and the second electrode pad may contact the first lead exposing plane and the second lead exposing plane, respectively, such that at least one of other sides of the rectangular shape of each of the first lead exposing plane and the second lead exposing plane is coincident with at least one side of each of the first electrode pad and the second electrode pad.

Each of the first lead exposing plane and the second lead exposing plane may be partially extended in an outward direction.

Each of the first lead exposing plane and the second lead exposing plane may have a polygonal concave shape.

Each of the first lead exposing plane and the second lead exposing plane may have an octagonal or dodecagonal concave shape.

Each of the first lead exposing plane and the second lead exposing plane may have a polygonal shape formed by extending a portion of one side of a rectangular shape in the outward direction.

Each of the first lead exposing plane and the second lead exposing plane may have a polygonal shape formed by extending a portion of each of three sides of a rectangular shape in the outward direction.

Each of the first lead exposing plane and the second lead exposing plane may have a hexagonal shape; the first electrode pad and the second electrode pad may contact the first lead exposing plane and the second lead exposing plane, respectively, such that at least one side of each of the first and second electrode pads is coincident with at least one side of each of the first and second lead exposing planes, while allowing the entirety of the first electrode pad and the second electrode pad to contact the first lead exposing plane and the second lead exposing plane, respectively.

Each of the first lead exposing plane and the second lead exposing plane may have a surface not contacting the first electrode pad or the second electrode pad at a location opposite to at least one side thereof at which the first electrode pad and the second electrode pad are coincident with the first lead exposing plane and the second lead exposing plane, respectively.

Each of the first lead exposing plane and the second lead exposing plane may have a surface not contacting the first electrode pad or the second electrode pad at opposite locations with respect to at least one side thereof at which the first electrode pad and the second electrode pad are coincident with the first lead exposing plane and the second lead exposing plane, respectively.

At least one corner of each of the first electrode pad and the second electrode pad may contact at least one side of each of the first lead exposing plane and the second lead exposing plane each having the hexagonal shape.

Each of the first lead and the second lead may be partially exposed to the lower surface of the cavity of the housing and may include a Zener diode mounting portion and a Zener diode connecting portion to which a Zener diode chip is electrically connected.

Each of a first groove formed on the first lead and a second groove formed on the second lead may have an asymmetrical structure in which one side thereof is asymmetrical to the other side thereof opposite to the one side.

For example, one side surface of each of the first groove and the second groove may be placed under an inner surface of the housing defining the cavity. Further, a portion of the other side surface of each of the first groove and the second groove may be placed between the inner surface of the housing and an outer surface of the housing.

A width from one side of the first groove to one side of the first lead exposing plane facing the one side of the first groove may be greater than a width from the other side of the first lead exposing plane to one side of the Zener diode mounting portion facing the other side of the first lead exposing plane.

A width from one side of the second groove to one side of the second lead exposing plane facing the one side of the second groove may be greater than a width from the other side of the second lead exposing plane to one side of the Zener diode connecting portion facing the other side of the second lead exposing plane.

A portion of a side surface of each of the first lead and the second lead may be exposed to a side surface of the housing.

The light emitting diode package may further include a sealing member filling the cavity of the housing.

In some embodiments, a light emitting diode package includes a light emitting diode chip provided at a lower side thereof with a first electrode pad and a second electrode pad, a first lead and a second lead spaced apart from each other and contacting the first electrode pad and the second electrode pad of the light emitting diode chip to be electrically connected thereto, respectively, and a housing formed to surround the first lead and the second lead and having a cavity open at a top portion thereof. The first lead and the second lead have a first lead exposing plane and a second lead exposing plane disposed on a lower surface of the cavity of the housing such that the first lead and the second lead are at least partially exposed and electrically connected to the first electrode pad and the second electrode pad, respectively. The first lead exposing plane has a size that corresponds to a size of the first electrode pad.

In at least one variation, the first lead includes a first groove formed on an upper surface such that the first lead exposing plane is exposed to the lower surface of the cavity and the first groove of the first lead is placed within the housing and not exposed in the cavity.

In another variation, the second lead exposing plane has a size that corresponds to a size of the second electrode pad, and the second lead includes a second groove on an upper surface such that the second lead exposing plane is exposed to the lower surface of the cavity and the second groove of the second lead is not exposed in the cavity and placed within the housing.

In another variation, the first electrode pad has a rectangular shape, the first lead exposing plane has a rectangular shape, the first electrode pad is superimposed on the first lead exposing plane for electrical connection, and the size of the rectangular shape of the first lead exposing plane is greater than the size of the first electrode pad such that a part of the first lead exposing plane extends relative to the first electrode pad.

In another variation, the first electrode pad contacts the first lead exposing plane such that at least one side of the first lead exposing plane is coincident with at least one side of the first electrode pad. In further another variation, each of the first lead exposing plane and the second lead exposing plane is partially extended in an outward direction relative to the light emitting diode chip. The first lead exposing plane has a polygonal concave shape and the second lead exposing plane has a shape symmetric to the shape of the first lead exposing plane.

In some forms, each of the first lead exposing plane and the second lead exposing plane has an octagonal or dodecagonal concave shape. In another form, each of the first lead exposing plane and the second lead exposing plane has a polygonal shape including a rectangular shape and an extended part from one side of a rectangular shape in an outward direction relative to the light emitting diode chip. In at least one variation, each of the first lead exposing plane and the second lead exposing plane has a polygonal shape including a rectangular shape and extended parts from three sides of the rectangular shape in an outward direction relative to the light emitting diode chip.

In some forms, the first lead exposing plane has a hexagonal shape; and the first electrode pad contacts the first lead exposing plane, such that at least one side of the first electrode pad is coincident with at least one side of the first lead exposing plane, while the entire first electrode pad contacts the first lead exposing plane.

In some forms, the second lead exposing plane has the shape and the size that are symmetric to the shape and the size of the first lead exposing plane. The first lead exposing plane has a surface not contacting the first electrode pad at a location opposite to the side coincident with the first lead. The second lead exposing plane has a first side that is coincident with at least one side of the second lead and a second side that is not coincident with the second lead.

In other forms, the first lead exposing plane and the second lead exposing plane have a hexagonal shape. At least one corner of the first electrode pad contacts at least one side of the first lead exposing plane. At least one corner of the second electrode pad contacts at least one side of the second lead exposing plane.

In some forms, the light emitting diode package further includes a Zener diode mounting portion, and a Zener diode connecting portion to which a Zener diode chip is electrically connected. In at least one variant, the first lead comprises a first groove having a first side and a second side that is opposite and asymmetric to the first side; and the second lead comprises a second groove having a third side and a fourth side that is opposite and asymmetric to the third side.

In other forms, the first groove is arranged between a first side surface and a second side surface, the second side surface exposed to an outside of the housing and the first side surface placed within the housing. The second groove is arranged between a third side surface and a fourth side surface, the fourth side surface exposed to the outside of the housing and the third side surface placed within the housing.

In at least one variation, a distance between the first side and the second side of the first groove is greater than a shortest distance between the first lead exposing plane and the Zener diode mounting portion. A distance between the third side and the fourth side of the second groove is greater than a shortest distance between the second lead exposing plane and the Zener diode connecting portion. A portion of the first lead is exposed to a side surface of the housing and a portion of the second lead is exposed to an opposite side surface of the housing.

In another variation, the light emitting diode package further includes a sealing member filling the cavity of the housing.

According to embodiments of the present disclosure, a light emitting diode package employs a flip-chip type light emitting diode chip and minimizes exposure of a first lead and a second lead, thereby maximizing luminous efficacy of the light emitting diode package.

Further, each of the first lead and the second lead for electrical connection to the light emitting diode chip is formed with a groove on an upper surface thereof, thereby minimizing exposure of the first lead and the second lead through a cavity of the housing.

Further, upon soldering for electrical connection of the light emitting diode chip to the first lead and the second lead, the first lead and the second lead are formed in greater sizes than a first electrode pad and a second electrode pad formed on the light emitting diode chip, thereby improving bonding strength between the light emitting diode chip and each of the first lead and the second lead while minimizing generation of solder balls protruding from the first lead and the second lead.

Furthermore, each of the first lead and the second lead exposed to the lower surface of the cavity for electrical connection to the light emitting diode chip is partially extended in the lateral direction. With this structure, the first electrode pad and the second electrode pad of the light emitting diode chip are placed corresponding to the shapes of the exposed first and second leads, whereby the light emitting diode chip can be placed at an accurate location while minimizing generation of solder balls protruding from the first lead and the second lead.

DETAILED DESCRIPTION

Figure 1:
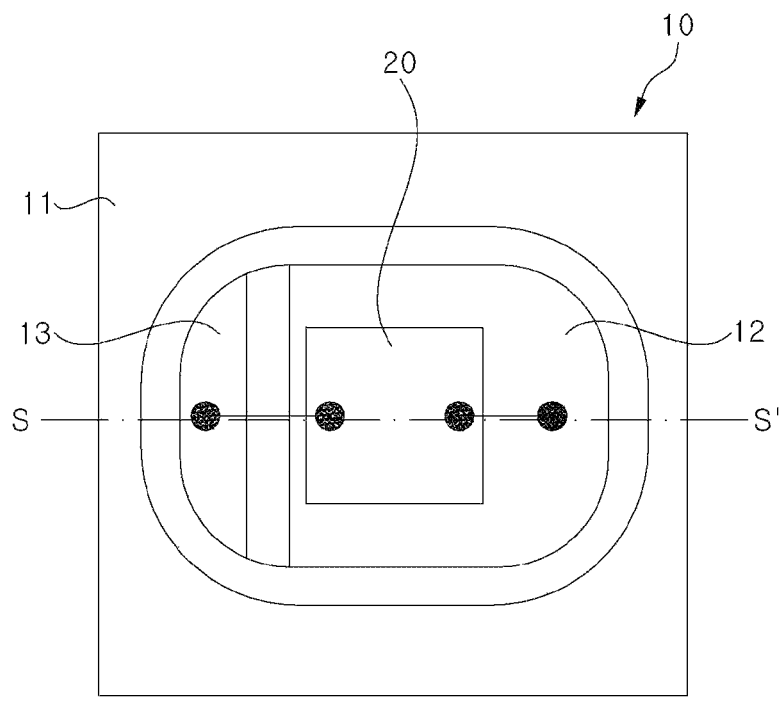
FIG. 1 and FIG. 2 are a top plan view and a cross-sectional view of a typical light emitting diode package, respectively.
Figure 2:
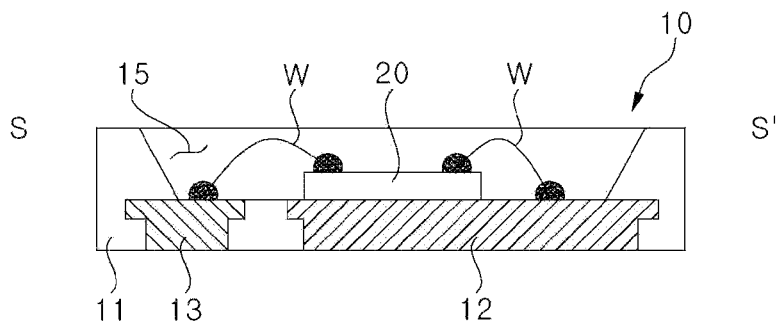

Hereinafter, embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. Throughout the specification, the same or like reference numerals denote the same or like elements.

Figure 3:
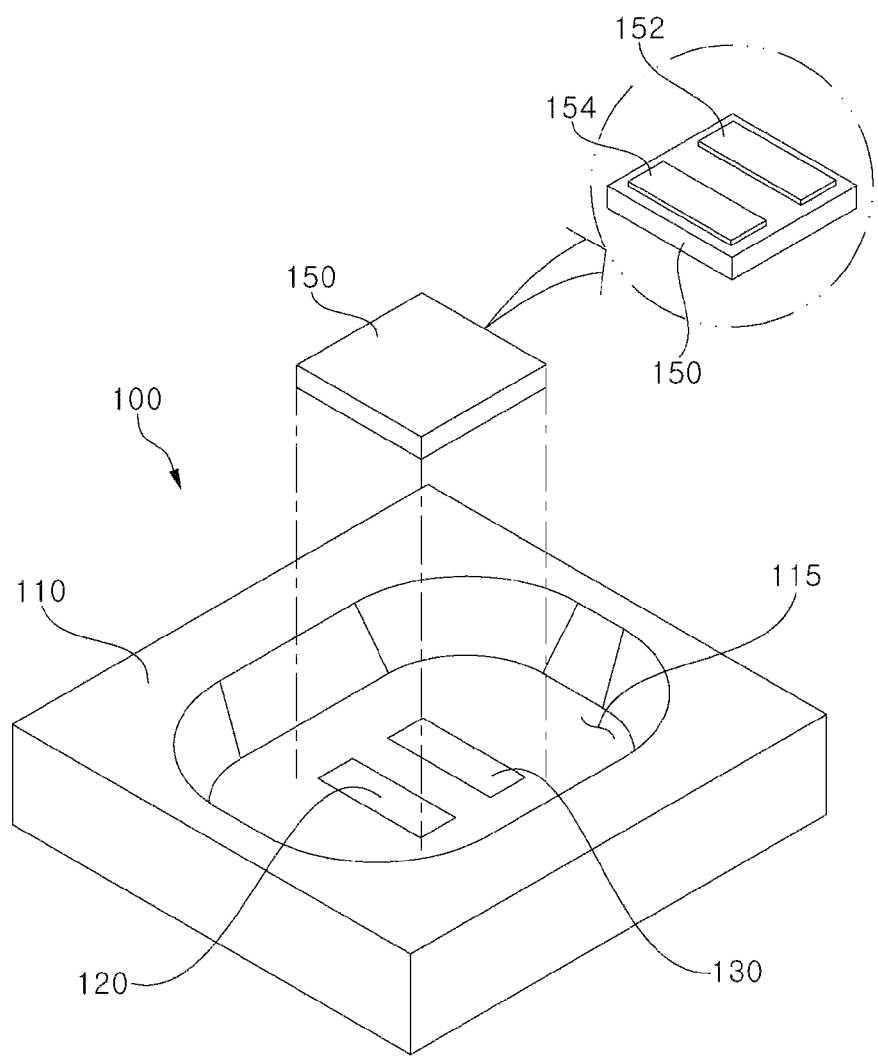
FIG. 3 is a perspective view of a light emitting diode package according to a first embodiment of the present disclosure.
Figure 4:
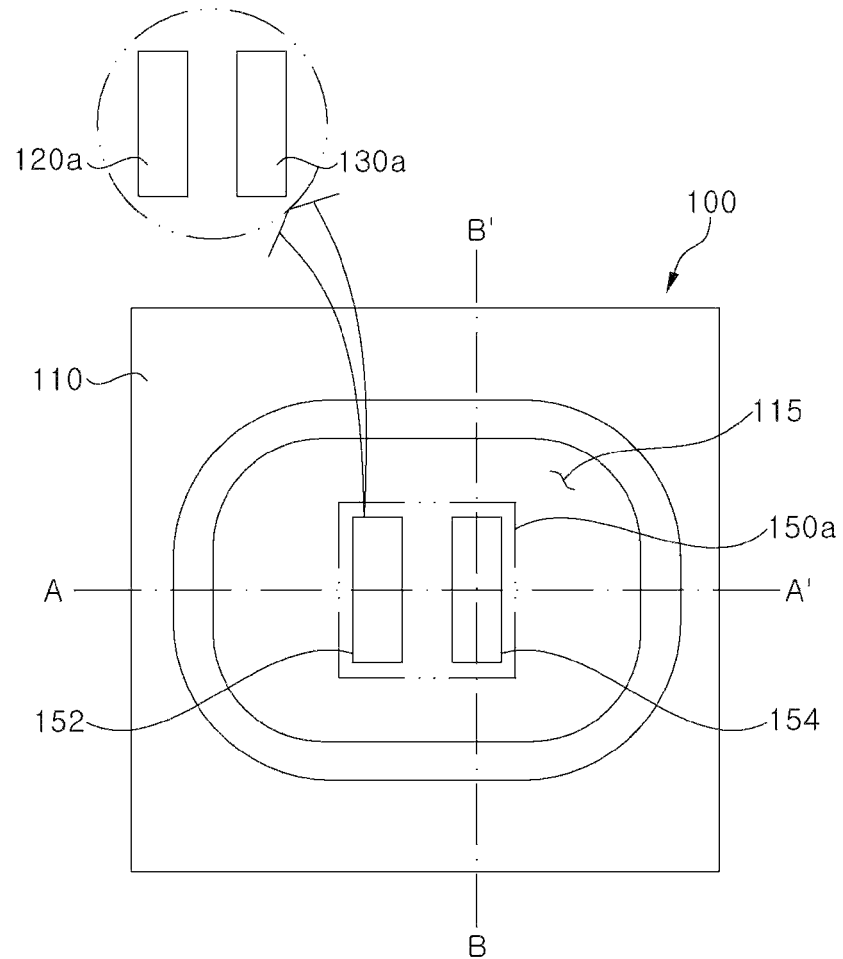
FIG. 4 is a top plan of the light emitting diode package according to the first embodiment of the present disclosure.
Figure 5:
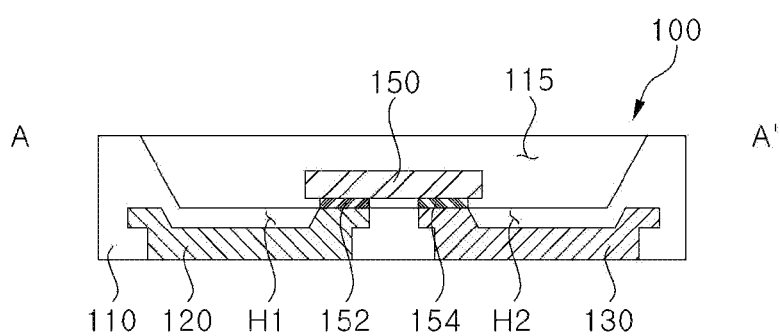
FIG. 5 is a cross-sectional view taken along A-A' of the light emitting diode package of FIG. 4.
Figure 6:
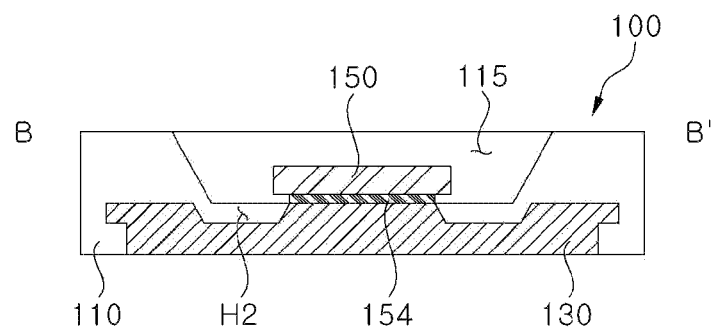
FIG. 6 is a cross-sectional view taken along B-B' of the light emitting diode package of FIG. 4.

FIG. 3 is a perspective view of a light emitting diode package according to a first embodiment of the present disclosure. FIG. 4 to FIG. 6 are a top plan view and cross-sectional views of the light emitting diode package according to the first embodiment of the present disclosure, respectively. Here, FIG. 5 is a cross-sectional view taken along line A-A' of FIG. 4 and FIG. 6 is a cross-sectional view taken along line B-B' of FIG. 4.

First, referring to FIG. 3, a light emitting diode package 100 according to a first embodiment includes a housing 110, a first lead 120, a second lead 130, and a light emitting diode chip 150.

The housing 110 is formed to surround the first lead 120 and the second lead 130 so as to support the first lead 120 and the second lead 130. As shown in FIG. 3, the first lead 120 and the second lead 130 may be formed in a cavity 115 of the housing 110. The housing 110 may be structured to expose a portion of an upper surface of each of the first lead 120 and the second lead 130 through the cavity 115, instead of completely surrounding the entirety of the first lead 120 and the second lead 130.

The first lead 120 and the second lead 130 are spaced apart from each other and serve to supply electric power to the light emitting diode chip 150. As shown in FIG. 4, the first lead 120 and the second lead 130 include a first lead exposing plane 120a and a second lead exposing plane 130a that are exposed within the cavity 115 of the housing 110. As shown in FIG. 5, the first lead 120 and the second lead 130 may be exposed to a lower surface of the housing 110.

In some forms, the second lead exposing plane 130a has the shape and the size that are symmetric to the shape and the size of the first lead exposing plane 120a.

Referring to FIG. 5 and FIG. 6, a first groove H1 and a second groove H2 are formed on upper surfaces of the first lead 120 and the second lead 130, respectively. Referring to FIG. 5, in a cross-section of the first lead 120 along the A-A' line of FIG. 4, a first portion of the first lead 120 corresponding to a location of the light emitting diode chip 150 mounted on the first lead 120 protrudes upwards to form a first lead exposing plane 120a exposed to an inner surface of the cavity 115. In addition, a second portion of the first lead 120 opposite to the first portion in the direction of the A-A' line may also protrude upwards as shown in FIG. 5. As a result, the first lead 120 is formed with the first groove H1, which has the same shape as that of the cavity 115 defined in the housing 110. The first groove H1 is disposed between the first and the second protruding portions of the first lead 120 at opposite sides on the upper surface of the first lead 120. In some forms, the entirety of a lower surface of the first lead 120 is exposed to the lower surface of the housing 110.

Upper ends of the first and the second portions of the first lead 120 protrude in an outward direction, as shown in FIG. 5. The outward direction here is in parallel to the A-A' line. With the structure wherein the upper ends of the opposite sides of the first lead 120 protrude a predetermined length in the outward direction, a contact area between the first lead 120 and the housing 110 increases, thereby improving bonding strength between the first lead 120 and the housing 110.

As the first groove H1 is formed on the upper surface of the first lead 120, the first lead 120 may be restrictively exposed to the cavity 115 of the housing 110. In this embodiment, the first lead 120 exposed to the cavity 115 may have a size corresponding to the size of a first electrode pad 152 of the light emitting diode chip 150, as shown in FIG. 5.

Likewise, the second lead 130 may have a symmetrical shape to the first lead 120 in sectional view, as shown in FIG. 5. The second groove H2 having a shape corresponding to the cavity 115 defined in the housing 110 is formed on the upper surface of the second lead 130. Further, the entirety of a lower surface of the second lead 130 is exposed to the lower surface of the housing 110, as shown in FIG. 5.

A first portion of the second lead 130 corresponding to a location of the light emitting diode chip 150 mounted on the second lead 130 protrudes upwards to form a second lead exposing plane 130a exposed to the inner surface of the cavity 115. In addition, a second portion of the second lead 130 opposite to the first portion of the second lead 130 along the A-A' line may also protrude upwards. As a result, the second lead 130 is formed with the second groove H2 between the first and the second protruding portions of the second lead 130. The first and the second portions of the second lead 130 are disposed at opposite sides on the upper surface of the second lead 130, as shown in FIG. 5.

Upper ends of the opposite sides of the second lead 130 protrude in an outward direction as shown in FIG. 5. As the upper ends of the opposite sides of the second lead 130 protrude by a predetermined length in the outward direction, a contact area between the second lead 130 and the housing 110 increases, thereby improving bonding strength between the second lead 130 and the housing 110.

Further, the second groove H2 is formed on the upper surface of the second lead 130, and the second lead 130 may be restrictively exposed to the cavity 115 of the housing 110. In this embodiment, the second lead 130 exposed to the cavity 115 may have a size corresponding to the size of a second electrode pad 154 of the light emitting diode chip 150.

The light emitting diode package may include at least one light emitting diode chip 150, which may be placed on the first lead 120 and the second lead 130 exposed to a bottom surface or lower surface of the cavity 115. According to this embodiment, the light emitting diode chip 150 may be provided at a lower side thereof with the first electrode pad 152 and the second electrode pad 154, and may emit light when electric power is applied thereto through the first electrode pad 152 and the second electrode pad 154. The light emitting diode chip 150 includes an n-type semiconductor layer, an active layer, and a p-type semiconductor layer.

Each of the n-type semiconductor layer, the active layer, and the p-type semiconductor layer may include a III-V group-based compound semiconductor, for example, a nitride semiconductor, such as (Al, Ga, In)N. In this embodiment, the active layer may be formed on the n-type semiconductor layer and the p-type semiconductor layer may be formed on the active layer. However, it should be understood that the locations of the n-type semiconductor layer and the p-type semiconductor layer may be changed, as needed.

The n-type semiconductor layer may include n-type dopants (for example, Si) and the p-type semiconductor layer may include p-type dopants (for example, Mg). The active layer is interposed between the n-type semiconductor layer and the p-type semiconductor layer, and may include a multi-quantum well (MQW) structure. The composition of the active layer may be adjusted to generate light having a desired peak wavelength.

In this embodiment, the first electrode pad 152 and the second electrode pad 154 on the light emitting diode chip 150 may be electrically connected to the p-type semiconductor layer and the n-type semiconductor layer, respectively, or vice versa.

As described above, the first lead 120 and the second lead 130 exposed to the cavity 115 of the housing 110 have the exposed sizes corresponding to the first electrode pad 152 and the second electrode pad 154 of the light emitting diode chip 150, respectively. The light emitting diode chip 150 is mounted on the first lead 120 and the second lead 130 via solders. Accordingly, the first electrode pad 152 and the second electrode pad 154 have sizes corresponding to the first lead 120 and the second lead 130, thereby allowing the light emitting diode chip 150 to be mounted at the precise locations on the first lead 120 and the second lead 130 when the light emitting diode chip 150 is mounted thereon.

Furthermore, according to this embodiment, an exposed region of each of the first lead 120 and the second lead 130 may be minimized and an inner surface of the cavity 115 is defined by the housing 110, which has higher reflectivity than a metal forming the first lead 120 and the second lead 130, thereby maximizing luminous efficacy of the light emitting diode package 100. Further, since a separate wire is not used to supply electric power to the light emitting diode chip 150, light emitted from the light emitting diode chip 150 can be prevented from being obstructed by the wire.

Figure 7:
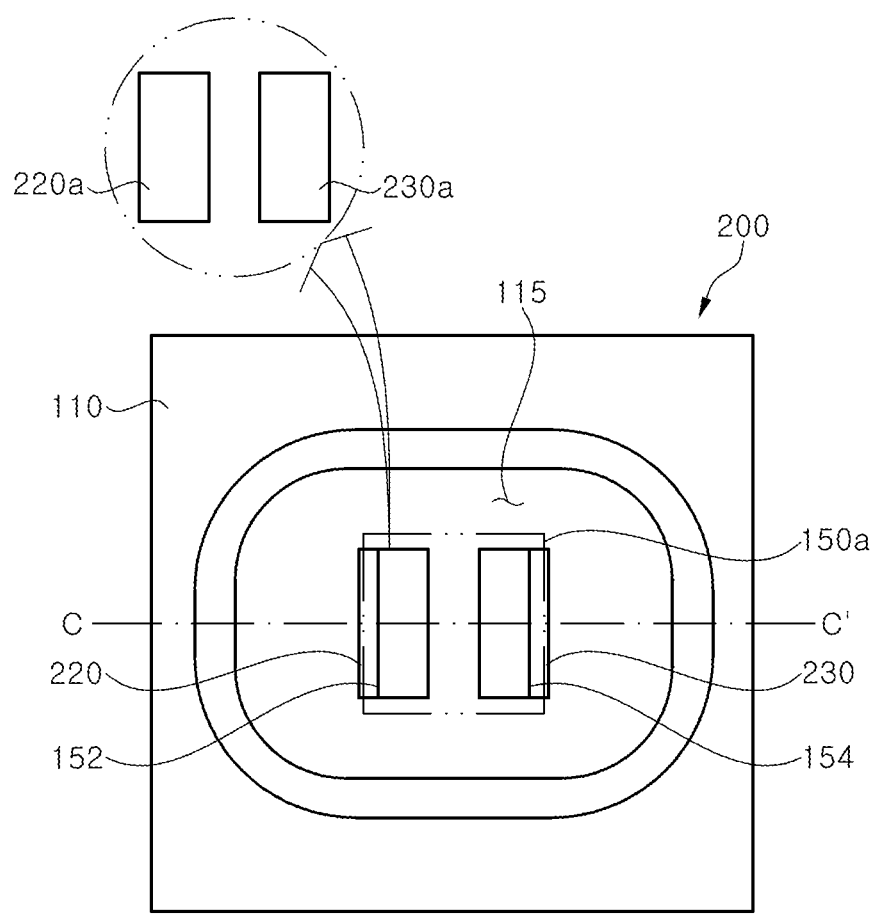
FIG. 7 is a top plan view of a light emitting diode package according to a second embodiment of the present disclosure.
Figure 8:
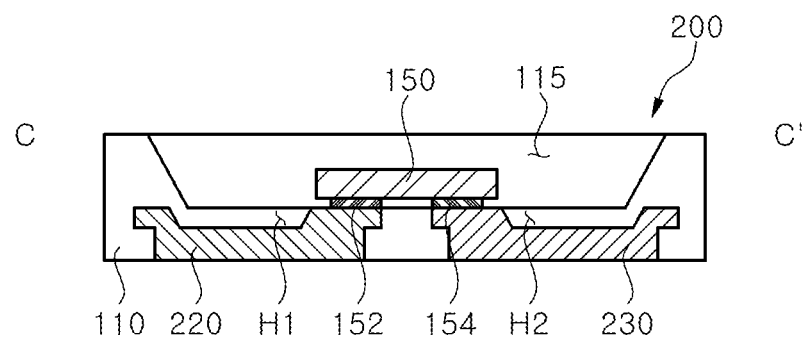
FIG. 8 is a cross-sectional view taken along C-C' of a light emitting diode package of FIG. 7.

FIG. 7 and FIG. 8 are a top plan view and a cross-sectional view of a light emitting diode package according to a second embodiment of the present disclosure, respectively. Here, FIG. 8 is a cross-sectional view taken along line C-C' of FIG. 7.

Referring to FIG. 7 and FIG. 8, a light emitting diode package 200 according to the second embodiment includes the housing 110, a first lead 220, a second lead 230, and the light emitting diode chip 150. Description of the same components as those of the first embodiment will be omitted.

The light emitting diode package 200 according to this embodiment generally has the same configuration as the light emitting diode package according to the first embodiment but the shapes of the first lead exposing plane 220a and the second lead exposing plane 230a, on which the first lead 220 and the second lead 230 are exposed to the cavity 115 of the housing 110, differ.

Referring to FIG. 7, the first lead 220 and the second lead 230 are partially exposed at opposite sides of the light emitting diode chip mounting region 150a, on which the light emitting diode chip 150 is mounted. That is, although each of the first lead exposing plane 220a and the second lead exposing plane 230a may have a rectangular shape as in the first embodiment, the first lead exposing plane 220a and the second lead exposing plane 230a may have greater sizes than those 120a, 130a of the first embodiment.

In this embodiment, the first lead exposing plane 220a and the second lead exposing plane 230a may have greater sizes than the first electrode pad 152 and the second electrode pad 154 of the light emitting diode chip 150, respectively. Here, the first lead exposing plane 220a may have a rectangular shape having an enlarged size in a leftward direction, as compared with the first electrode pad 152, with reference to FIG. 7 and FIG. 8. When the first electrode pad 152 is brought into contact with the first lead exposing plane 220a, three sides of the rectangular shape of the first electrode pad 152 are coincident with the corresponding three sides of the first lead exposing plane 220a in plan view.

Further, the second lead exposing plane 230a may have a rectangular shape having an enlarged size in a rightward direction, as compared with the second electrode pad 154, with reference to FIG. 7 and FIG. 8. That is, when the second electrode pad 154 is brought into contact with the second lead exposing plane 230a, three sides of the rectangular shape of the second electrode pad 154 are coincident with the corresponding three sides of the second lead exposing plane 230a in plan view.

As a result, when the light emitting diode chip 150 is mounted on the first and second electrode pads 152, 154 such that the first and second electrode pads 152, 154 contact the first lead exposing plane 220a and the second lead exposing plane 230a, respectively, the first lead exposing plane 220a and the second lead exposing plane 230a may be exposed at both sides of the light emitting diode chip 150, as shown in FIG. 8.

With the structure where the first lead exposing plane 220a and the second lead exposing plane 230a have larger sizes than the first electrode pad 152 and the second electrode pad 154 of the light emitting diode chip 150, the light emitting diode package 200 according to this embodiment can prevent generation of solder balls formed by solders sticking out of lateral sides of the first electrode pad 152 and the second electrode pad 154 even when the amount of the solders for bonding the first lead exposing plane 220a and the second lead exposing plane 230a to the first electrode pad 152 and the second electrode pad 154 happens to increase. The solder balls excessively protruding from the lateral sides of the first electrode pad 152 and the second electrode pad 154 may cause short circuit. The light emitting diode package 100 according to this embodiment can minimize generation of the solder balls, thereby minimizing failure of the light emitting diode package 100.

Figure 9:
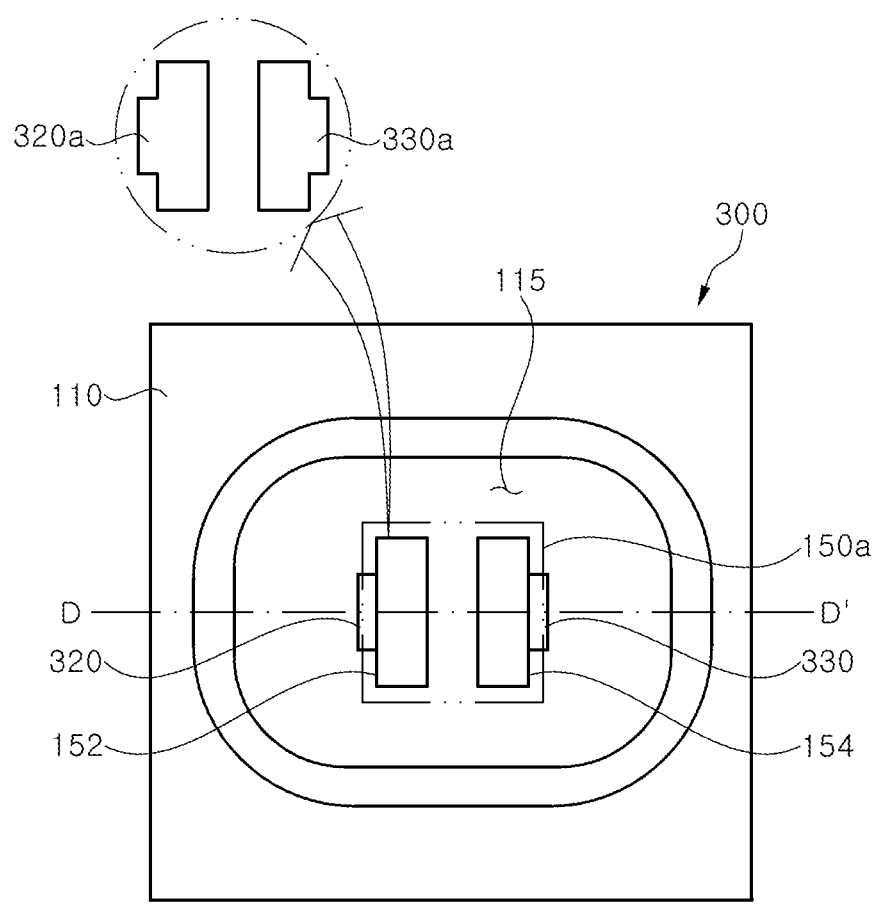
FIG. 9 is a top plan view of a light emitting diode package according to a third embodiment of the present disclosure.
Figure 10:
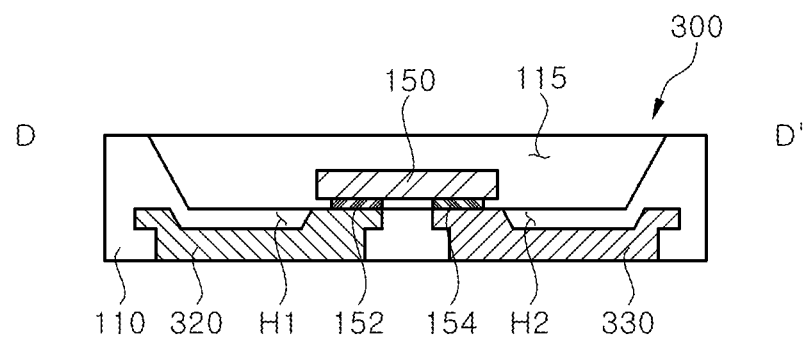
FIG. 10 is a cross-sectional view taken along D-D' of the light emitting diode package FIG. 9.

FIG. 9 and FIG. 10 are a top plan view and a cross-sectional view of a light emitting diode package according to a third embodiment of the present disclosure, respectively. Here, FIG. 10 is a cross-sectional view taken along line D-D' of FIG. 9.

Referring to FIG. 9 and FIG. 10, a light emitting diode package 300 according to the third embodiment includes the housing 110, a first lead 320, a second lead 330, and a light emitting diode chip 150. Description of the same components as those of the first embodiment will be omitted.

The light emitting diode package according to this embodiment has the same configuration as the light emitting diode package according to the first embodiment. However, the shapes of a first lead exposing plane 320a and a second lead exposing plane 330a, through which the first lead 320 and the second lead 330 are exposed in the cavity 115 of the housing 110.

Referring to FIG. 9, the first lead 320 and the second lead 330 are partially exposed at both sides of the light emitting diode chip mounting region 150a, on which the light emitting diode chip 150 is mounted. That is, each of the first lead exposing plane 320a and the second lead exposing plane 330a may have a rectangular shape and having one side partially protruding outwards, as shown in FIG. 9.

In this embodiment, the first lead exposing plane 320a and the second lead exposing plane 330a may have larger sizes than the first electrode pad 152 and the second electrode pad 154 of the light emitting diode chip 150. As shown in FIG. 10, the size of each of the first and second lead exposing planes 320a, 330a is enlarged by the outwardly protruding portion thereof, as described above.

The first lead exposing plane 320a may have a shape of Korean alphabet vowel, 'ㅓ' formed by extending a portion of the left side of the rectangular shape with reference to FIG. 9. In addition, as one side of the first lead exposing plane 320a is partially extended in the lateral direction, four corners of the first electrode pad 152 having a rectangular shape may be disposed to be coincident with corresponding four corners of the first lead exposing plane 320a.

The second lead exposing plane 330a may have a shape of Korean alphabet vowel, 'ㅏ' shape formed by extending a portion of the right side of the rectangular shape with reference to FIG. 9. In addition, as one side of the second lead exposing plane 330a is partially extended in the lateral direction, four corners of the second electrode pad 154 having a rectangular shape may be disposed to be coincident with corresponding four corners of the second lead exposing plane 330a.

In this way, the shapes of the first lead exposing plane 320a and the second lead exposing plane 330a correspond to the shapes of the first electrode pad 152 and the second electrode pad 154 and have the lateral sides partially extended in the lateral direction, respectively, whereby the light emitting diode chip 150 can be mounted at the precise locations on the first lead exposing plane 320a and the second lead exposing plane 330a. That is, the light emitting diode chip 150 may be mounted thereon such that the four corners of each of the first electrode pad 152 and the second electrode pad 154 correspond to the four corners of each of the first lead exposing plane 320a and the second lead exposing plane 330a, thereby minimizing a tilting phenomenon upon mounting of the light emitting diode chip 150.

Further, each of the first lead exposing plane 320a and the second lead exposing plane 330a is partially extended outwards in the lateral direction, thereby minimizing generation of solder balls at the lateral side of the first electrode pad 152 or the second electrode pad 154 even when the amount of solders for bonding the light emitting diode chip 150 is increased.

Figure 11:
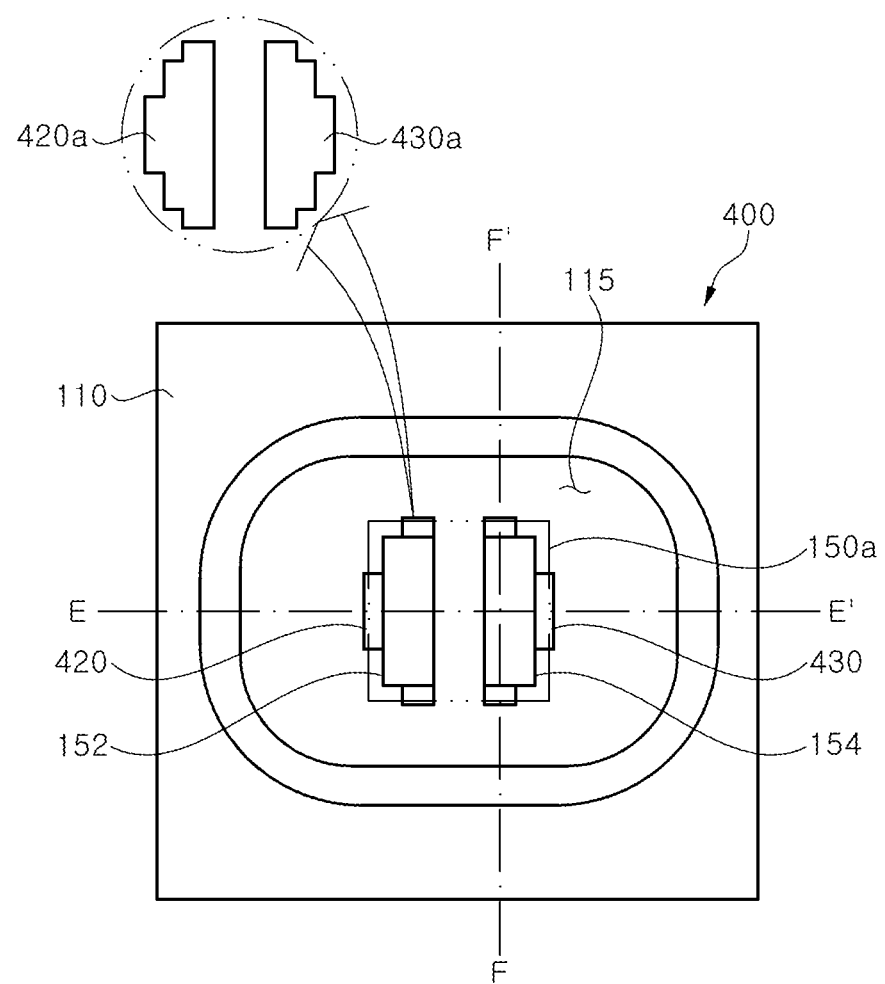
FIG. 11 is a top plan view a light emitting diode package according to a fourth embodiment of the present disclosure.
Figure 12:
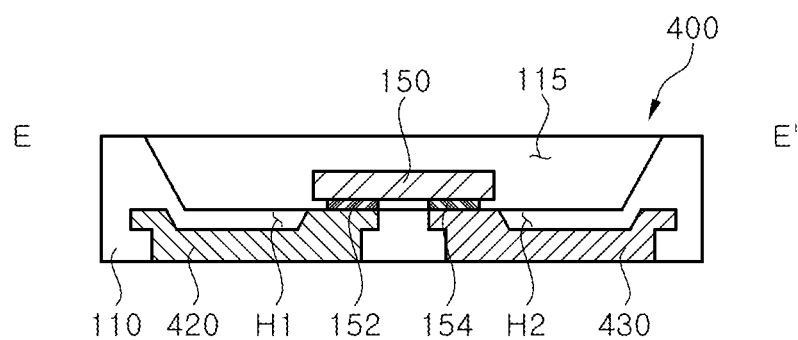
FIG. 12 is a cross-sectional view taken along E-E' of the light emitting diode package of FIG. 11.
Figure 13:
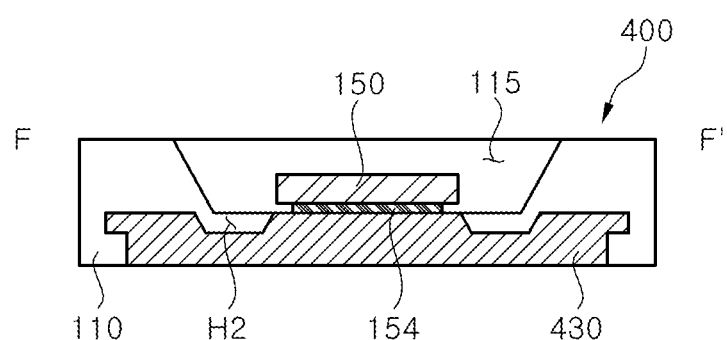
FIG. 13 is a cross-sectional view taken along F-F' of the light emitting diode package of FIG. 11.

FIG. 11 to FIG. 13 are a top plan view and cross-sectional views of a light emitting diode package according to a fourth embodiment of the present disclosure, respectively. Here, FIG. 12 is a cross-sectional view taken along line E-E' of FIG. 11 and FIG. 13 is a cross-sectional view taken along line F-F' of FIG. 11.

Referring to FIG. 11 and FIG. 12, a light emitting diode package 400 according to the fourth embodiment includes the housing 110, a first lead 420, a second lead 430, and a light emitting diode chip 150. Description of the same components as those of the first embodiment will be omitted.

The light emitting diode package 400 according to this embodiment has different shapes of a first lead exposing plane 420a and a second lead exposing plane 430a, through which the first lead 420 and the second lead 430 are exposed to the cavity 115 of the housing 110, as shown in FIG. 11.

Referring to FIG. 11, the first lead 420 and the second lead 430 are partially exposed at opposite sides and at upper and lower sides of the light emitting diode chip mounting region 150a, on which the light emitting diode chip 150 is mounted. That is, each of the first lead exposing plane 420a and the second lead exposing plane 430a may have a rectangular shape having three sides partially protruding outwards.

In this embodiment, the first lead exposing plane 420a and the second lead exposing plane 430a may have larger sizes than the first electrode pad 152 and the second electrode pad 154 of the light emitting diode chip 150, in which the size of each of the first and second lead exposing planes 420a, 430a is enlarged by the outwardly protruding portion thereof, as described above.

The first lead exposing plane 420a may have a shape formed by extending a portion of the left side of the rectangular shape and a portion of each of the upper and lower sides of the rectangular shape with reference to FIG. 11. That is, the first lead exposing plane 420a may have a shape formed by outwardly extending a portion of each of the other sides of the rectangular shape excluding the right side thereof. As three sides of the first lead exposing plane 420a are partially extended in the outward direction, four corners of the first electrode pad 152 having a rectangular shape may be disposed to be coincident with corresponding four corners of the first lead exposing plane 420a, as shown in FIG. 12.

The second lead exposing plane 430a may have a shape formed by extending a portion of the right side and a portion of each of the upper and lower sides of the rectangular shape with reference to FIG. 11. That is, the second lead exposing plane 430a may have a shape formed by outwardly extending a portion of each of the other sides of the rectangular shape excluding the left side thereof. As three sides of the second lead exposing plane 130a are partially extended in the outward direction, four corners of the second electrode pad 154 having a rectangular shape may be disposed to be coincident with corresponding four corners of the second lead exposing plane 430a, as shown in FIG. 12.

In this way, the shapes of the first lead exposing plane 420a and the second lead exposing plane 430a correspond to the shapes of the first electrode pad 152 and the second electrode pad 154 and have the lateral sides partially extended in the outward direction, whereby the light emitting diode chip 150 can be mounted at the precise locations on the first lead exposing plane 420a and the second lead exposing plane 430a. That is, the light emitting diode chip 150 may be mounted thereon such that the four corners of each of the first electrode pad 152 and the second electrode pad 154 correspond to the four corners of each of the first lead exposing plane 420a and the second lead exposing plane 430a, thereby minimizing a tilting phenomenon upon mounting of the light emitting diode chip 150.

Further, the lateral side of each of the first lead exposing plane 420a and the second lead exposing plane 430a is partially extended in the outward direction, thereby minimizing generation of solder balls at the lateral side of the first electrode pad 152 or the second electrode pad 154 even when the amount of solders for bonding the light emitting diode chip 150 is increased.

Figure 14:
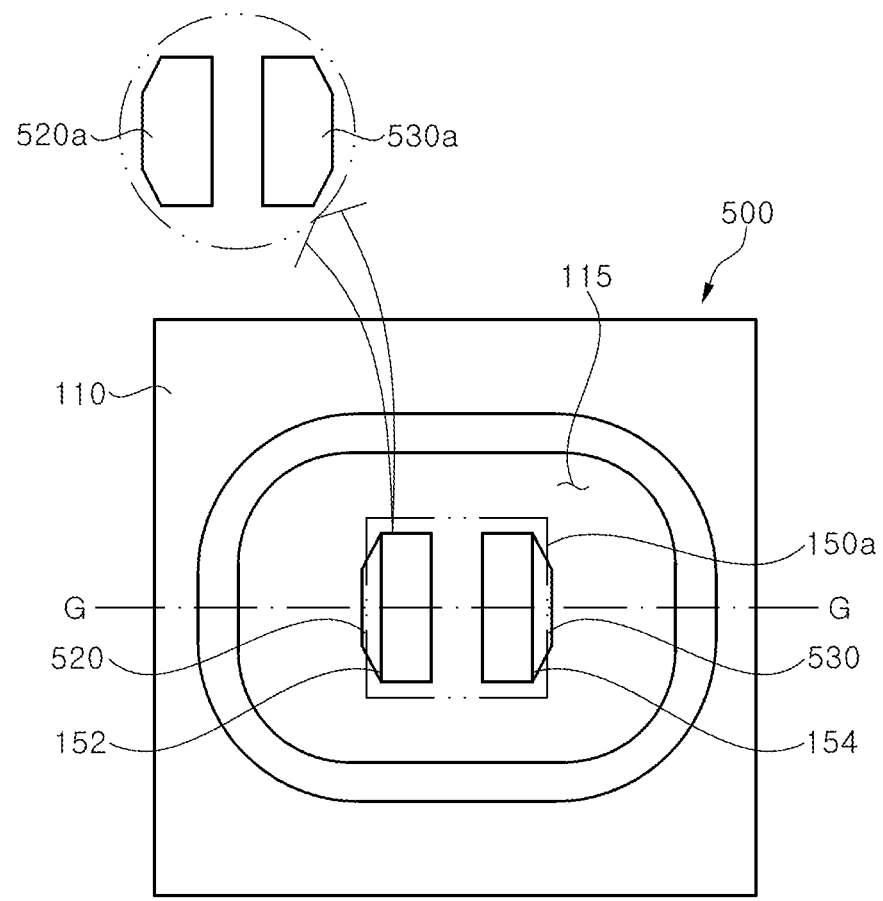
FIG. 14 is a top plan view of a light emitting diode package according to a fifth embodiment of the present disclosure.
Figure 15:
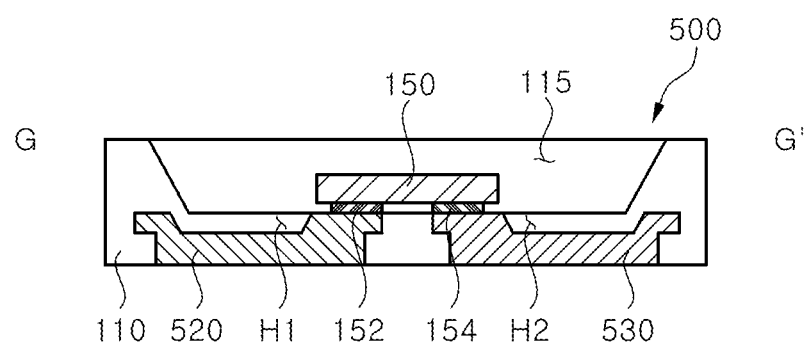
FIG. 15 is a cross-sectional view taken along G-G' of the light emitting diode package of FIG. 14.

FIG. 14 and FIG. 15 are a top plan view and a cross-sectional view of a light emitting diode package according to a fifth embodiment of the present disclosure, respectively. FIG. 15 is a cross-sectional view taken along line G-G' of FIG. 14.

Referring to FIG. 14 and FIG. 15, a light emitting diode package 500 according to the fifth embodiment includes a housing 110, a first lead 520, a second lead 530, and the light emitting diode chip 150. Description of the same components as those of the first embodiment will be omitted.

The light emitting diode package 500 according to this embodiment has different shapes of the first lead exposing plane 120a and the second lead exposing plane 130a, on which the first lead 120 and the second lead 130 are exposed to the cavity 115 of the housing 110.

Referring to FIG. 14, the first lead 520 and the second lead 530 are partially exposed at opposite sides of the light emitting diode chip mounting region 150a, on which the light emitting diode chip 150 is mounted. That is, each of the first lead exposing plane 520a and the second lead exposing plane 530a may have a rectangular shape having one side partially protruding outwards.

In this embodiment, the first lead exposing plane 520a and the second lead exposing plane 530a may have larger sizes than the first electrode pad 152 and the second electrode pad 154 of the light emitting diode chip 150, in which the size of each of the first and second lead exposing planes 520a, 530a is enlarged by the outwardly protruding portion thereof, as shown in FIG. 14.

The first lead exposing plane 520a may have a hexagonal shape having a left side enlarged in the outward direction with reference to FIG. 14. In addition, as one side of the first lead exposing plane 120a is partially extended in the lateral direction, four corners of the first electrode pad 152 having a rectangular shape may be disposed to be coincident with corresponding four corners of the first lead exposing plane 520a. The extended side of the first lead exposing plane 520a does not contact the first electrode pad 520.

The second lead exposing plane 530a may have a hexagonal shape having a right side enlarged in the outward direction with reference to FIG. 14. In addition, as one side of the second lead exposing plane 530a is partially extended in the lateral direction, four corners of the second electrode pad 154 having a rectangular shape may be disposed to be coincident with corresponding four corners of the second lead exposing plane 530a. The extended side of the second lead exposing plane 530a does not contact the second electrode pad 530.

In this way, the shapes of the first lead exposing plane 520a and the second lead exposing plane 530a correspond to the shapes of the first electrode pad 152 and the second electrode pad 154 and have the lateral sides partially extended in the lateral direction, respectively, whereby the light emitting diode chip 150 can be mounted at the precise locations on the first lead exposing plane 120a and the second lead exposing plane 130a. That is, the light emitting diode chip 150 may be mounted thereon such that the four corners of each of the first electrode pad 152 and the second electrode pad 154 correspond to the four corners of each of the first lead exposing plane 520a and the second lead exposing plane 530a, thereby minimizing a tilting phenomenon upon mounting the light emitting diode chip 150.

Further, each of the first lead exposing plane 520a and the second lead exposing plane 530a is partially extended in the lateral direction, thereby minimizing generation of solder balls at the lateral side of the first electrode pad 152 or the second electrode pad 154 even when the amount of solders for bonding the light emitting diode chip 150 may increase.

Figure 16:
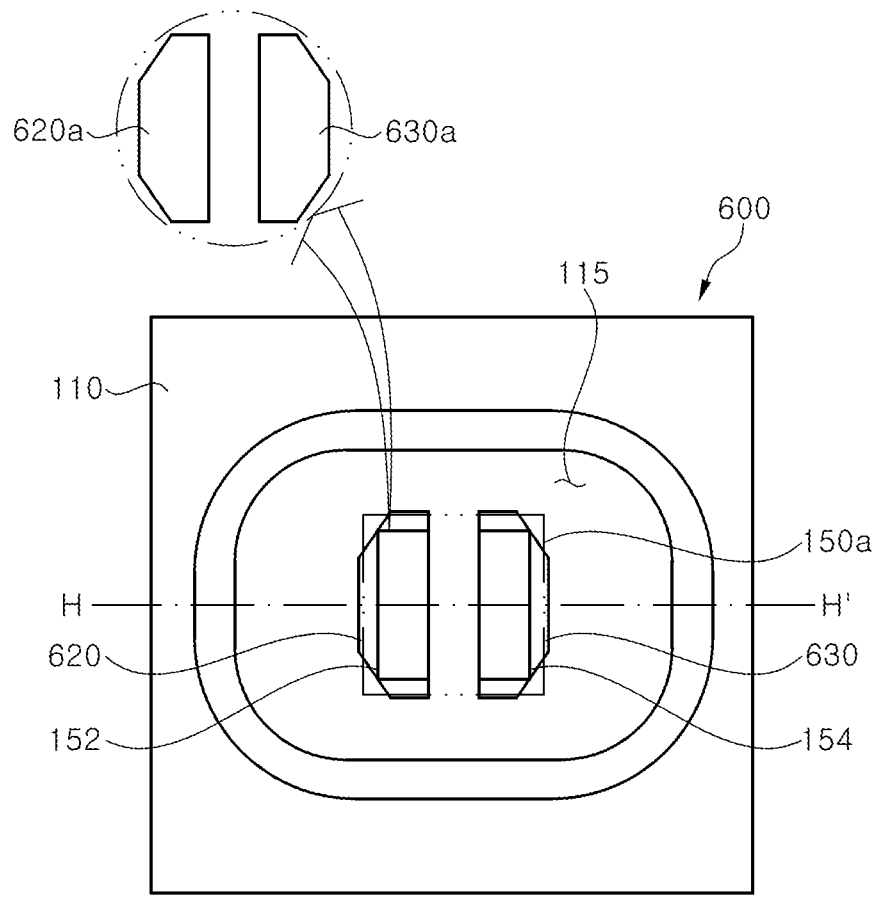
FIG. 16 is a top plan view of a light emitting diode package according to a sixth embodiment of the present disclosure.
Figure 17:
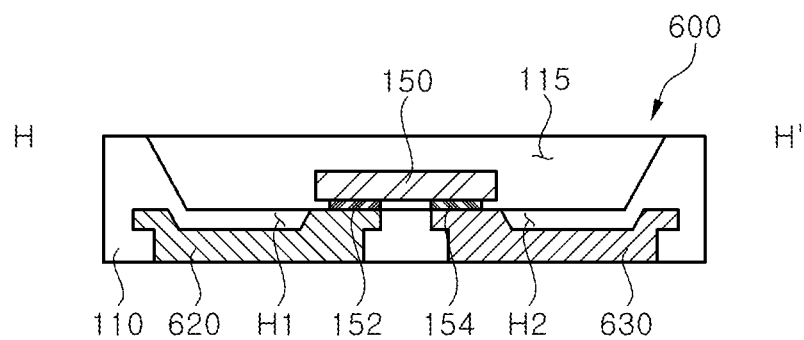
FIG. 17 is a cross-sectional view taken along H-H' of the light emitting diode package of FIG. 16.

FIG. 16 and FIG. 17 are a top plan view and a cross-sectional view of a light emitting diode package 600 according to a sixth embodiment of the present disclosure, respectively. FIG. 17 is a cross-sectional view taken along line H-H' of FIG. 16.

Referring to FIG. 16 and FIG. 17, the light emitting diode package 600 according to the sixth embodiment includes the housing 110, a first lead 620, a second lead 630, and the light emitting diode chip 150. Description of the same components as those of the first embodiment will be omitted.

The light emitting diode package 600 according to this embodiment has different shapes of the first lead exposing plane 620a and the second lead exposing plane 630a, on which the first lead 620 and the second lead 630 are exposed to the cavity 115 of the housing 110.

Referring to FIG. 16, the first lead 620 and the second lead 630 are partially exposed at opposite sides and at upper and lower sides of the light emitting diode chip mounting region 150a, on which the light emitting diode chip 150 is mounted. That is, each of the first lead exposing plane 620a and the second lead exposing plane 630a may have a rectangular shape having three sides partially protruding outwards.

In this embodiment, the first lead exposing plane 620a and the second lead exposing plane 630a may have larger sizes than the first electrode pad 152 and the second electrode pad 154 of the light emitting diode chip 150, in which the size of each of the first and second lead exposing planes 620a, 630a is enlarged by the outwardly protruding portion thereof, as described above.

The first lead exposing plane 620a may have a shape formed by enlarging the left side and each of the upper and lower sides of the rectangular shape with reference to FIG. 16. That is, the first lead exposing plane 620a may have a hexagonal shape formed by outwardly enlarging the other sides of the rectangular shape excluding the right side thereof. As three sides of the first lead exposing plane 620a are enlarged in the outward direction, left two corners of the first electrode pad 152 having four corners may be disposed at locations corresponding to middle points of the lateral sides of the hexagonal shape of the first lead exposing plane 620a.

The second lead exposing plane 630a may have a shape formed by enlarging the right side and each of the upper and lower sides of the rectangular shape with reference to FIG. 16. That is, the second lead exposing plane 630a may have a hexagonal shape formed by outwardly enlarging the other sides of the rectangular shape excluding the left side thereof. As the three sides of the second lead exposing plane 630a are enlarged in the outward direction, right two corners of the second electrode pad 154 having four corners may be disposed at locations corresponding to middle points of the lateral sides of the hexagonal shape of the second lead exposing plane 630a.

In this way, the shapes of the first lead exposing plane 620a and the second lead exposing plane 630a correspond to the shapes of the first electrode pad 152 and the second electrode pad 154 and have the lateral sides enlarged in the outward direction, respectively, whereby the light emitting diode chip 150 can be mounted at the precise locations on the first lead exposing plane 620a and the second lead exposing plane 630a. Accordingly, the light emitting diode package 600 according to this embodiment can minimize a tilting phenomenon upon mounting the light emitting diode chip 150.

Further, each of the first lead exposing plane 620a and the second lead exposing plane 630a has the lateral side partially extended in the outward direction, thereby minimizing generation of solder balls at the lateral side of the first electrode pad 152 or the second electrode pad 154 even when the amount of solders for bonding the light emitting diode chip 150 may increase.

Figure 18:
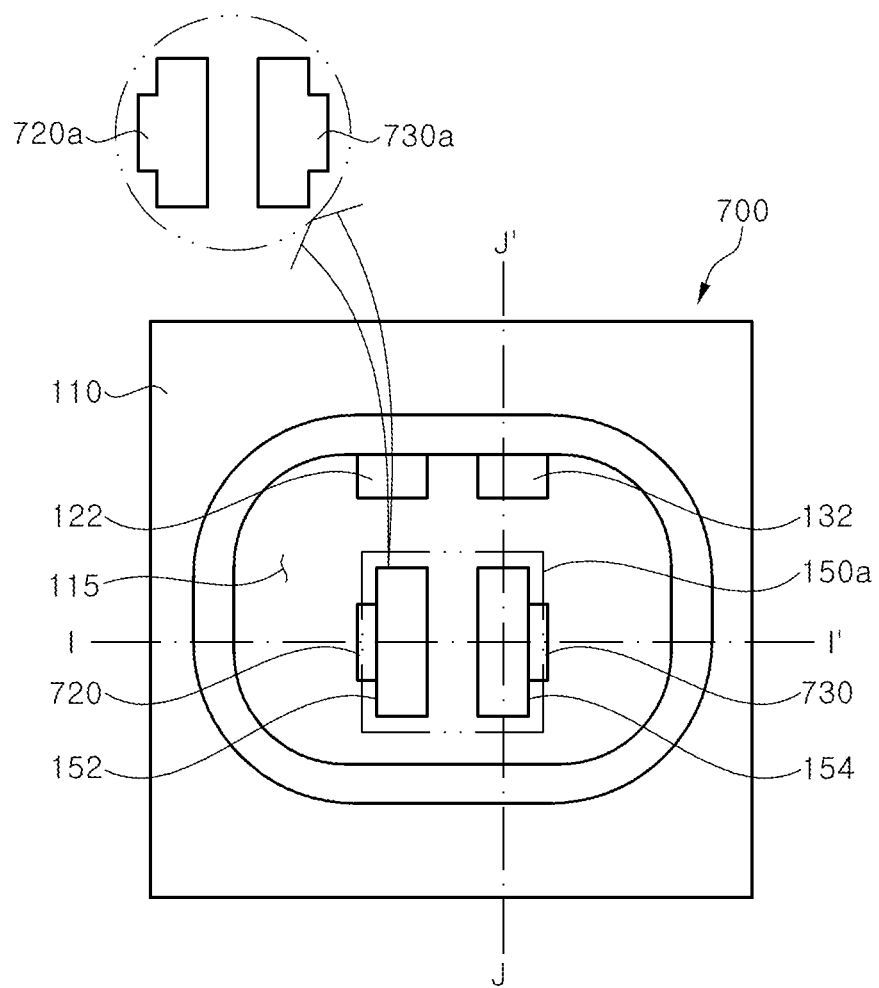
FIG. 18 is a top plan view and cross-sectional views of a light emitting diode package according to a seventh embodiment of the present disclosure.
Figure 19:
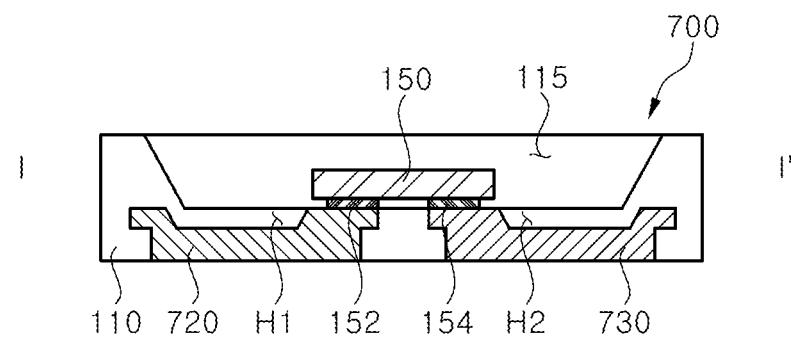
FIG. 19 is a cross-sectional view taken along I-I' of the light emitting diode package of FIG. 18.
Figure 20:
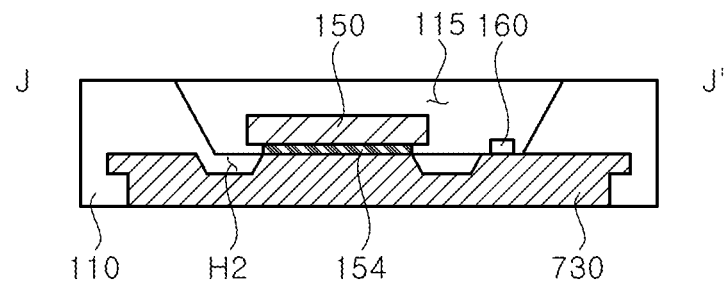
FIG. 20 is a cross-sectional view taken along J-J' of the light emitting diode package of FIG. 18.

FIG. 18 to FIG. 20 are a top plan view and cross-sectional views of a light emitting diode package 700 according to a seventh embodiment of the present disclosure, respectively. Here, FIG. 19 is a cross-sectional view taken along line I-I' of FIG. 18 and FIG. 20 is a cross-sectional view taken along line J-J' of FIG. 18.

Referring to FIG. 18 to FIG. 20, the light emitting diode package 700 according to the seventh embodiment includes the housing 110, a first lead 720, a second lead 730, and the light emitting diode chip 150. Description of the same components as those of the third embodiment will be omitted.

That is, it should be noted that this embodiment is a modification of the third embodiment and the other embodiments may also be modified as in this embodiment.

Referring to FIG. 18, the light emitting diode package 700 may further include a Zener diode mounting portion 122 and a Zener diode connecting portion 132 inside the cavity 115 of the housing 110. To this end, the locations of the first lead exposing plane 720a and the second lead exposing plane 730a may be adjusted. Here, the Zener diode mounting portion 122 and the Zener diode connecting portion 132 may be biased to one side of the cavity 115, as shown in FIG. 18.

Referring to FIG. 20, a Zener diode chip may be mounted on the Zener diode mounting portion 122 and may be electrically connected to the Zener diode connecting portion 132 via a wire.

The Zener diode chip mounted on the Zener diode mounting portion may be covered by a reflective member. As a result, it is possible to minimize absorption of light by the Zener diode chip when light is emitted from the light emitting diode chip. The reflective member may be formed of a silicone resin containing a reflective material, such as $TiO_2$.

Figure 21:
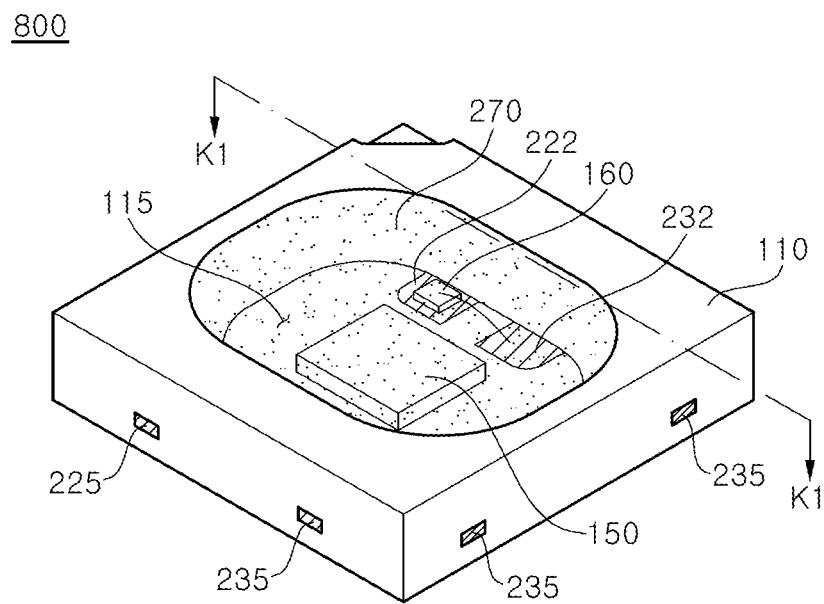
FIG. 21 is a perspective view of a light emitting diode package according to an eighth embodiment of the present disclosure.
Figure 22:
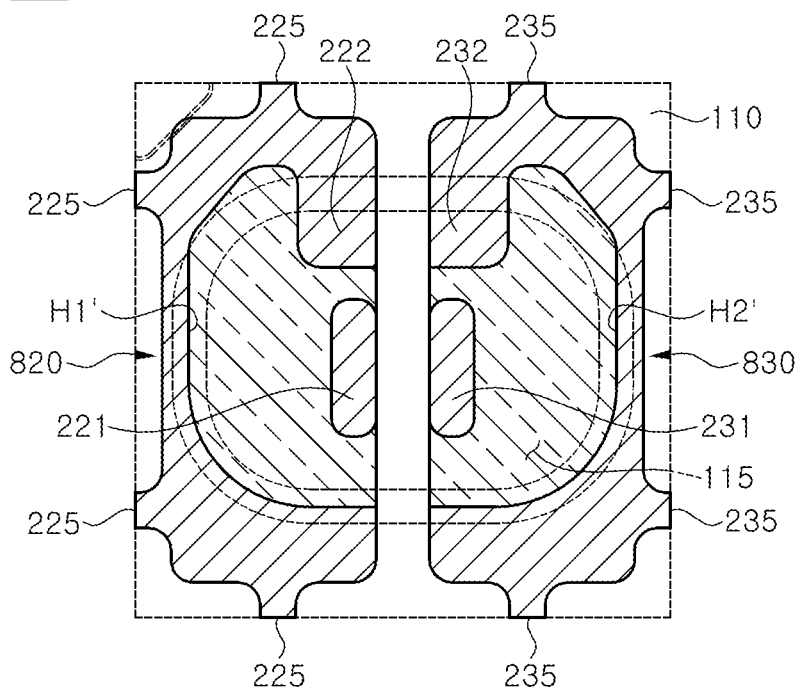
FIG. 22 is a plan view of the light emitting diode of FIG. 21.
Figure 23:
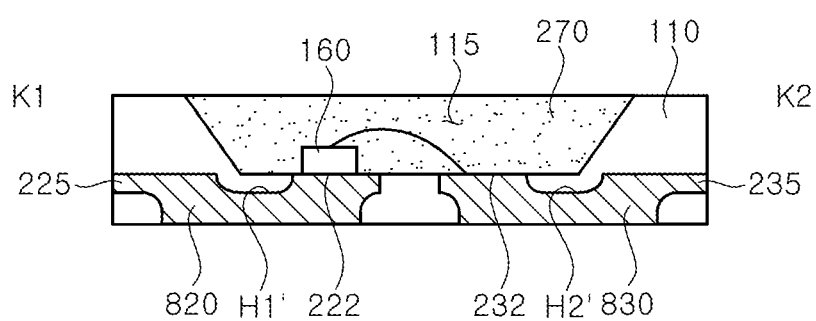
FIG. 23 is a cross-sectional view of the light emitting diode of FIG. 21.

FIG. 21 to FIG. 23 are views of a light emitting diode package 800 according to an eighth embodiment of the present disclosure, respectively.

FIG. 21 is a perspective view of a light emitting diode package 200 according to the eighth embodiment. FIG. 22 is a top plan view of the light emitting diode package 800 according to the eighth embodiment, showing a first lead 820 and a second lead 830. In FIG. 22, for description of the structure of each of the first lead 820 and the second lead 830 and the locations of the first groove H1' and the second groove H2', the housing 110 is illustrated with a dotted line. FIG. 23 is a cross-sectional view taken along line K1-K2 of FIG. 21.

The light emitting diode package 800 according to the eighth embodiment includes the housing 110, the first lead 820, the second lead 830, the light emitting diode chip 150, the Zener diode chip 160, and a molding portion 270. In the light emitting diode package 800 according to the eighth embodiment, the first lead 820 and the second lead 830 have different structures from those of the light emitting diode packages according to the above embodiments. The following description will focus on the structures of the first lead 820 and the second lead 830.

Referring to FIG. 22, each of the first groove H1' of the first lead 820 and the second groove H2' of the second lead 830 has an asymmetrical structure in which a first side is asymmetrical to a second side. Here, the first side of each of the first groove H1' and the second groove H2' refers to a side at which the Zener diode mounting portion 222 and the Zener diode connecting portion 232 are placed. The second side of each of the first groove H1' and the second groove H2' refers to a side opposite to the first side.

The first groove H1' is arranged between a first side surface and a second side surface 225, and the second side surface 225 is exposed to an outside of the housing and the first side surface is placed within the housing. The second groove H2' is arranged between a third side surface and a fourth side surface 235, and the fourth side surface 235 is exposed to the outside of the housing 110 and the third side surface is placed within the housing 110.

In other words, the first side surface of the first groove H1' is placed under an inner surface of the housing 110. Here, the first side surface of the first groove H1' refers to a side surface thereof placed at one side of an inner surface of the first lead 820, which defines the first groove H1'. In addition, the inner surface of the housing 110 defines the cavity 115.

A portion of the other side surface, the first side surface of the first groove H1' facing the second side surface 225 thereof is placed under the cavity 115. This portion corresponds to a side surface of the Zener diode mounting portion 222 in the first lead 820. Further, another portion of the first side surface of the first groove H1' is placed between the inner surface of the housing 110 and an outer surface of the housing 110. The first side surface of the first groove H1' corresponding to a portion of the first groove H1' more deeply depressed than other portions of the first groove H1' is connected to a side surface of the Zener diode mounting portion 222.

As such, the first groove H1' has an asymmetrical structure in which a portion of the other side surface thereof has a greater length than one side surface thereof with reference to the center of the cavity 115.

The structure where the first side surface of the first groove H1' is more deeply depressed than the other portions thereof allows the Zener diode mounting portion 222 to be formed in a sufficiently large area. In addition, it is possible to prevent a portion of the first lead 820 adjacent to the Zener diode mounting portion 222 from being exposed to the cavity 115. That is, with the structure where the first side surface of the first groove H1' is more deeply depressed than the other portions thereof, the area of the Zener diode mounting portion 222 can be secured in consideration of injection tolerance of the first lead 820 while minimizing an exposed area of the first lead 820 exposed to the cavity 115 of the housing 110. The light emitting diode package 800 according to this embodiment can prevent absorption of light by the first lead 220 and discoloration of the first lead 220 by minimizing the exposed area of the first lead 220 exposed to the cavity 115 of the housing 110, thereby improving reliability.

The second groove H2' of the second lead 830 may be symmetrical to the first groove H1' of the first lead 820. Accordingly, the second groove H2' of the second lead 830 also has an asymmetrical structure in which a portion of the other side surface thereof has a greater length than one side surface thereof with reference to the center of the cavity 115.

A width from one side of the first groove H1' to one side of the first lead exposing plane 221 may be greater than a width from the other side of the first lead exposing plane 221 to one side of the Zener diode mounting portion 222. Here, the one side of the first groove H1' faces the one side of the first lead exposing plane 221 and the other side of the first lead exposing plane 221 faces the one side of the Zener diode mounting portion 222.

In other words, a distance between the first side and the second side of the first groove H1' is greater than a shortest distance between the first lead exposing plane 221 and the Zener diode mounting portion 222.

A width from one side of the second groove H2' to one side of the second lead exposing plane 231 may be greater than a width form the other side of the second lead exposing plane 231 to one side of the Zener diode connecting portion 232. Here, the one side of the second groove H2' faces the one side of the second lead exposing plane 231 and the other side of the second lead exposing plane 231 faces the one side of the Zener diode connecting portion 232.

In other words, a distance between the third side and the fourth side of the second groove H2' is greater than a shortest distance between the second lead exposing plane 231 and the Zener diode connecting portion 232. A portion of the first lead 820 is exposed to a side surface of the housing 110 and a portion of the second lead 830 is exposed to an opposite side surface of the housing 110.

Referring to FIG. 21, each of the first lead 820 and the second lead 830 is partially exposed to the side surface of the housing 110. That is, the first lead 820 includes a first lead exposing side surface 225 exposed to the side surface of the housing 110. In addition, the second lead 830 includes a second lead exposing side surface 235 exposed to the side surface of the housing 110.

Referring to FIG. 22, a portion of one side surface of each of the first lead 820 and the second lead 830 is removed by etching such that another portion thereof protrudes in the lateral direction. One surface of the first lead 820 protruding in the lateral direction is the first lead exposing side surface 225. In addition, one surface of the second lead 830 protruding in the lateral direction is the second lead exposing side surface 235. With this structure, the side surface of each of the first lead 820 and the second lead 830 has an increased area. As a result, bonding strength between each of the first lead 820 and the second lead 830 and the housing 110 can be improved. Further, since a portion of the side surface of each of the first lead 820 and the second lead 830 is exposed outside the housing 110, heat dissipation paths of the light emitting diode package 800 are increased, thereby improving heat dissipation efficiency.

The molding portion 270 fills the cavity 115 of the housing 110. The molding portion 270 protects the light emitting diode chip 150 from an external environment, such as moisture, dust, and the like. Further, the molding portion 270 can protect the light emitting diode chip 150 from external impact. The molding portion 270 may be formed of a light transmitting resin. Further, the molding portion 270 may be formed of a light transmitting resin that contains a wavelength conversion material dispersed therein.

Although some embodiments have been described herein, it should be understood that these embodiments are provided for illustration only and are not to be construed in any way as limiting the present disclosure. Therefore, it should be understood that the scope of the present disclosure should be defined by the appended claims and equivalents thereto.

What is claimed is:

1. A light emitting diode package comprising:
a light emitting diode chip including a first electrode pad and a second electrode pad;
a first lead and a second lead spaced apart from each other and electrically connected to the first electrode pad and the second electrode pad of the light emitting diode chip, respectively; and
a housing formed to surround the first lead and the second lead and having a cavity open at a top portion thereof,
wherein the first lead and the second lead have a first lead exposing plane and a second lead exposing plane disposed on a lower surface of the cavity of the housing such that the first lead and the second lead are at least partially exposed and electrically connected to the first electrode pad and the second electrode pad, respectively, and
wherein the first lead exposing plane has a greater width than a width of the light emitting diode chip,
wherein the first lead has a first protrusion protruding outwards from a side surface of the first lead and the second lead has a second protrusion protruding outwards from a side surface of the second lead, and
wherein the first protrusion and the second protrusion extend in directions away from each other,
wherein the first lead and the second lead include a Zener diode mount region and a Zener diode connection region that are portion provided in the cavity to be spaced apart from each other,
wherein a distance from one side of a first groove of the first lead to one side of the first lead exposing plane is greater than a distance from the other side of the first lead exposing plane to one side of the Zener diode mount region.

2. The light emitting diode package according to claim 1, wherein the first lead includes a first groove formed on an upper surface thereof such that the first lead exposing plane is exposed to the lower surface of the cavity and the first groove of the first lead is placed within the housing and not exposed in the cavity.

3. The light emitting diode package according to claim 2, wherein the second lead exposing plane has a size that corresponds to a size of the second electrode pad, and
wherein the second lead includes a second groove on an upper surface such that the second lead exposing plane is exposed to the lower surface of the cavity and the second groove of the second lead is not exposed in the cavity and placed within the housing.

4. The light emitting diode package according to claim 1, wherein:
the first electrode pad has a rectangular shape;
the first lead exposing plane has a rectangular shape;
the first electrode pad is superimposed on the first lead exposing plane for electrical connection, and
the width of the rectangular shape of the first lead exposing plane is greater than the width of the first electrode pad such that a part of the first lead exposing plane extends relative to the first electrode pad.

5. The light emitting diode package according to claim 1, wherein the first electrode pad contacts the first lead exposing plane such that at least one side of the first lead exposing plane is coincident with at least one side of the first electrode pad.

6. The light emitting diode package according to claim 4, wherein each of the first lead exposing plane and the second lead exposing plane is partially extended in an outward direction relative to the light emitting diode chip.

7. The light emitting diode package according to claim 1, wherein the first lead exposing plane has a polygonal concave shape and the second lead exposing plane has a shape symmetric to the shape of the first lead exposing plane.

8. The light emitting diode package according to claim 7, wherein each of the first lead exposing plane and the second lead exposing plane has an octagonal or dodecagonal concave shape.

9. The light emitting diode package according to claim 1, wherein each of the first lead exposing plane and the second lead exposing plane has a polygonal shape including a rectangular shape and an extended part from one side of a rectangular shape in an outward direction relative to the light emitting diode chip.

10. The light emitting diode package according to claim 1, wherein each of the first lead exposing plane and the second lead exposing plane has a polygonal shape including a rectangular shape and extended parts from three sides of the rectangular shape in an outward direction relative to the light emitting diode chip.

11. The light emitting diode package according to claim 1, wherein:
the first lead exposing plane has a hexagonal shape; and
the first electrode pad contacts the first lead exposing plane, such that at least one side of the first electrode pad is coincident with at least one side of the first lead exposing plane, while the entire first electrode pad contacts the first lead exposing plane.

12. The light emitting diode package according to claim 11, wherein the second lead exposing plane has the shape and a size that are symmetric to the shape and the size of the first lead exposing plane.

13. The light emitting diode package according to claim 11, wherein the first lead exposing plane has a surface not contacting the first electrode pad at a location opposite to the at least one side coincident with the first lead.

14. The light emitting diode package according to claim 11, wherein the second lead exposing plane has a first side that is coincident with at least one side of the second lead and a second side that is not coincident with the second lead.

15. The light emitting diode package according to claim 1, wherein the first lead exposing plane and the second lead exposing plane have a hexagonal shape;
at least one corner of the first electrode pad contacts at least one side of the first lead exposing plane; and
at least one corner of the second electrode pad contacts at least one side of the second lead exposing plane.

16. The light emitting diode package according to claim 1, wherein the Zener diode mount region is configured to mount a Zener diode chip and the Zener diode chip is electrically connected to the Zener diode connection region.

17. The light emitting diode package according to claim 16, wherein the first lead comprises a first groove having a first side and a second side that is opposite and asymmetric to the first side; and the second lead comprises a second groove having a third side and a fourth side that is opposite and asymmetric to the third side.

18. The light emitting diode package according to claim 17, wherein:
the first groove is arranged between a first side surface and a second side surface of the first groove, the second side surface exposed to an outside of the housing and the first side surface placed within the housing; and
the second groove is arranged between a third side surface and a fourth side surface of the second groove, the fourth side surface exposed to the outside of the housing and the third side surface placed within the housing.

19. The light emitting diode package according to claim 17, wherein:
a distance between the first side and the second side of the first groove is greater than a shortest distance between the first lead exposing plane and the Zener diode mount region; and
a distance between the third side and the fourth side of the second groove is greater than a shortest distance between the second lead exposing plane and the Zener diode connection region.

20. The light emitting diode package according to claim 1, wherein a portion of the first lead is exposed to a side surface of the housing and a portion of the second lead is exposed to an opposite side surface of the housing.

21. The light emitting diode package according to claim 1, further comprising: a sealing member filling the cavity of the housing.

* * * * *